United States Patent [19]

Wolf

[11] 4,402,358
[45] Sep. 6, 1983

[54] HEAT PIPE THERMAL SWITCH

[75] Inventor: David A. Wolf, Baltimore, Md.

[73] Assignee: The United States of America as represented by the Administrator of the National Aeronautics and Space Administration, Washington, D.C.

[21] Appl. No.: 434,674

[22] Filed: Oct. 15, 1982

[51] Int. Cl.³ ............................................. F28F 13/00
[52] U.S. Cl. .................................. 165/32; 165/104.26
[58] Field of Search ............................. 165/32, 104.26

[56] References Cited

U.S. PATENT DOCUMENTS

| | | | |
|---|---|---|---|
| 3,399,717 | 9/1968 | Cline | 165/32 |
| 3,957,107 | 5/1976 | Altoz et al. | 165/32 |
| 4,000,776 | 1/1977 | Kroebig et al. | 165/32 |

Primary Examiner—Albert W. Davis, Jr.
Attorney, Agent, or Firm—Robert E. Bushnell; John R. Manning; John O. Tresansky

[57] ABSTRACT

A thermal switch for controlling the dissipation of heat between a body (20), acting as a heat source, and a heat sink (22). The thermal switch is comprised of a flexible bellows (12) defining an expansible vapor chamber for a working fluid located between an evaporation and condensation chamber (16, 14). Inside the bellows (12) is located a coiled retaining spring (54) and four axial metal mesh wicks (46, 48, 50, 52) two of which (46, 48) have their central portions located inside of the spring (54) while the other two (50, 52) have their central portions located between the spring (54) and the side wall of the bellows (12). The wicks are terminated and are attached to the inner surfaces (56, 58) of the outer end walls (60, 62) of evaporation and condensation chambers (14, 16) respectively located adjacent the heat source (20) and heat sink (22). The inner surfaces of the end walls furthermore include grooves (64, 66) to provide flow channels of the working fluid to and from the wick ends. The evaporation and condensation chambers are connected by turnbuckles (30, 31, 32) and tension springs (26, 27, 28) to provide a set point adjustment for setting the gap (24) between an interface plate 18 on the condensation chamber (14) and the heat sink (22).

17 Claims, 5 Drawing Figures

HEAT PIPE THERMAL SWITCH

ORIGIN OF THE INVENTION

The invention described herein was made under a NASA contract and is subject to provisions of Section 305 of the National Aeronautics Space Act of 1958, Public Law 85-568 (72 Stat. 435; 42 U.S.C. 2457) and accordingly may be manufactured and used by or for the Government for governmental purposes without the payment of any royalties thereon or therefor.

TECHNICAL FIELD

The invention relates generally to heat transfer control apparatus and more particularly to a thermal switch which operates to transfer heat from a heat source to a heat sink.

BACKGROUND ART

In applications where large variations in thermal conditions occur in relation to heat sensitive components, it becomes necessary to control the transfer of heat in order to maintain the operational thermal environment substantially constant. This is particularly so in spacecraft applications where large temperature differentials occur when surfaces are periodically exposed to or shielded, for example, from sunlight. Accordingly, the thermal environment is controlled by such dievices as variable conductance heat pipes, louvers or the like, or by means of thermal conductance devices such as thermal switches. Thermal switches have a large or relatively large ratio of maximum to minimum heat transfer in relation to louvers and are generally preferable for many applications. A thermal switch comprises a device which is capable of providing a region of variable thermal conductance which is generally temperature actuated. Known prior thermal switches utilize a number of actuating means such as bimetals, expanding fluids or materials which undergo a phase change. While known prior art devices tend to more or less operate as intended, they are subject to degradation due to vibratory loads and wear.

STATEMENT OF THE INVENTION

It is therefore an object of this invention to provide an improvement in apparatus for providing temperature control of a body during periods when transfer of heat is required and to inhibit the transfer at all other times.

Another object of the invention is to provide a thermal switch for providing temperature control of a body.

Still another object of the invention is to provide a thermal switch incorporating a heat pipe for providing a controlled thermal flow of heat from a heat source to a heat sink.

still a further object of the invention is to provide a thermal switch incorporating a heat pipe which is adapted to allow for relative mechanical motion between a body acting as a heat source and an adjacent heat sink.

These and other objects are achieved in accordance with a flexible heat pipe switch located between a heat source and a heat sink and comprising a condensation and evaporation chamber containing a vaporizable working fluid coupled by means of a bellows adapted to conduct fluid vapor therebetween. A coiled retaining spring is located inside the bellows together with two pairs of axial wicks, with one pair of wicks having their central portion located inside the spring and the second pair of wicks having their central portion located between the spring and the convoluted side wall of the bellows. The evaporation and condensation chambers include flat end wall members that have inner surfaces which are grooved and are adapted to be in contact with the end portions of the wicks to provide fluid conductive paths thereto. The evaporation and condensation chambers and the intervening bellows, moreover, are connected by turnbuckles and tension springs to provide a set point adjustment of the thermal switch. Upon reaching a predetermined temperature, evaporation of the working fluid causes the bellows to expand, bringing the condensation chamber end of the switch into contact with the heat sink where the vapor cools and condenses. The condensate is then returned to the evaporation chamber via the wicks. The cycle continues until the bellows contracts and thereby interrupts contact between the heat sink and the evaporation chamber.

The foregoing as well as other objects, features and advantages of the invention will become apparent from the following description taken in conjunction with the following drawings.

DETAILED DESCRIPTION OF THE INVENTION

Figure 1:
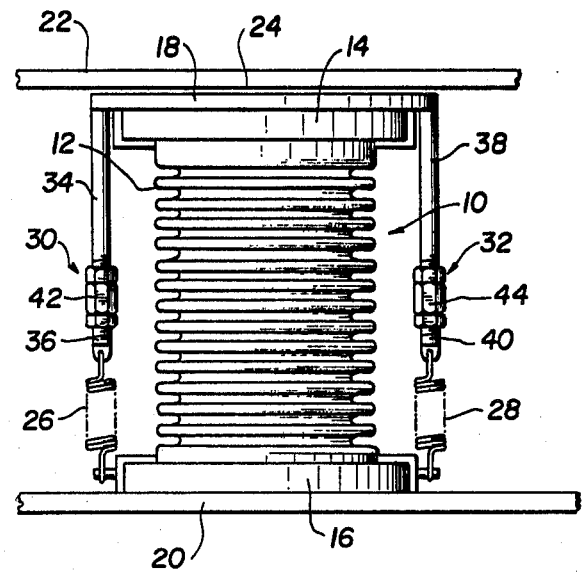
FIG. 1 is a front elevational view of the preferred embodiment of the invention.

Referring now to the drawings wherein like reference numerals refer to like parts throughout, the preferred embodiment of the invention as shown in FIG. 1 includes a heat pipe vapor chamber 10 comprised of a stainless steel bellows 12 which couples to an upper and lower vapor condensation and evaporation chamber 14 and 16 of generally circular configuration with a diameter substantially larger than the diameter of the bellows 12. The upper chamber 4 additionally includes a generally flat heat sink interface plate 18 of uniform thickness while the lower chamber 16 is mounted on a generally flat plate 20 which forms part of a heat source, not shown, and which, from time to time, requires the dissipation of heat therefrom to a heat sink. A flat heat sink plate 22 which comprises part of the heat sink, not shown, is adapted to receive heat coupled thereto from the heat source plate 20 via the heat pipe 10 when the interface plate 18 is in contact with the heat sink plate 22. As shown in FIG. 1, the interface plate is separated from the heat sink plate 22 by a relatively small gap 24.

As will be explained subsequently, a vapor pressure build-up in the bellows 12 will cause the bellows to expand and urge the interface plate 18 of the condensation chamber 14 against the heat sink plate 22, causing heat to be transferred to the heat sink. When the required transfer of heat is completed, the pressure inside of the bellows 12 decreases and the gap space 24 will be restored due to the action of three mutually spaced tension bias springs 26, 27 and 28 of which two springs 26 and 28 are shown in FIG 1 and which are connected between the lower vapor chamber 16 and the interface plate 18 on the outside of the condensation chamber 14. This connection is made by means of three turnbuckles 30, 31 and 32, two of which 30 and 32 are shown. The two turnbuckles illustrated are, respectively, comprised of pairs of threaded rods 34 and 36 and 38 and 40 which are coupled together by threaded nuts 42 and 44 which permit manual set point adjustment of the gap 24. The third turnbuckle 31 is likewise constructed.

Figure 2:
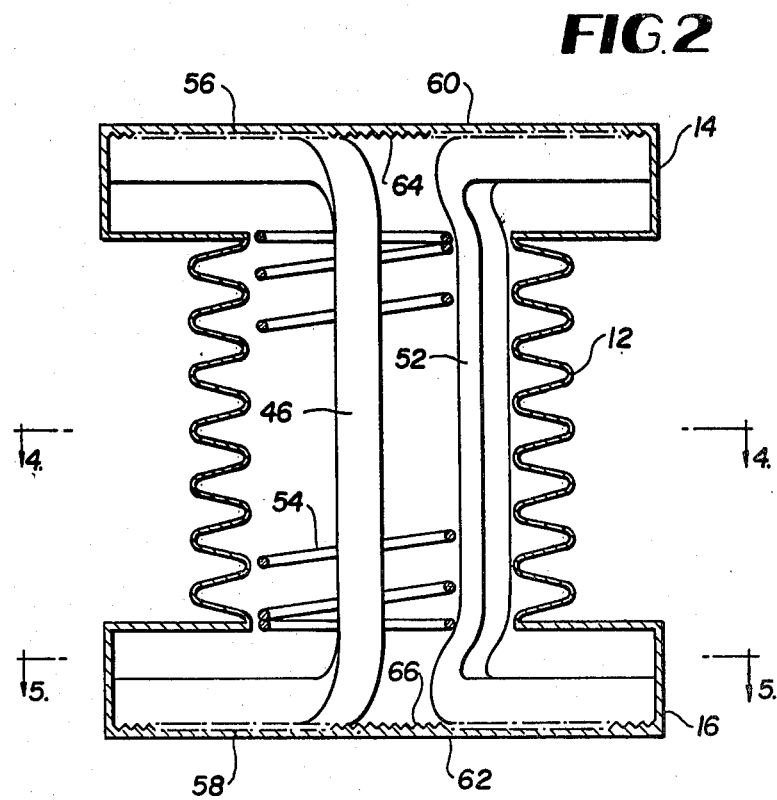
FIG. 2 is a central longitudinal section of the embodiment shown in FIG. 1 and is illustrative of the inner construction thereof.
Figure 4:
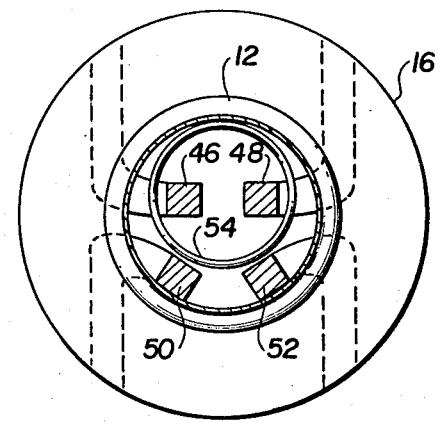
FIG. 4 is a cross sectional view of FIG. 2 taken along the lines 4—4 thereof.
Figure 5:
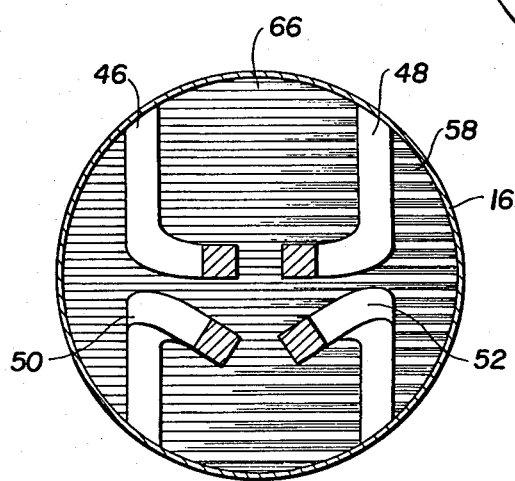
FIG. 5 is a cross sectional view of FIG. 2 taken along the lines 5—5 thereof.

Considering now the inner workings of the heat pipe switch shown in FIG. 1, reference is now made collectively to FIGS. 2, 4 and 5. These figures are intended to illustrate, inter alia, the shape and relative position of four capillary structures in the form of axial wick type members 46, 48, 50 and 52, hereinafter referred to simply as wicks, which are generally rectangular in cross section and fabricated, for example, from flexible stainless steel screen. The wicks are held in position within the bellows 12 by means of a helical retaining spring 54 with the central portions or segments of the wicks 46 and 48 being located on the inside of the spring 54 as shown in FIG. 4, while the central portions of the wicks 50 and 52 are located on the outside of the spring 54 such that they are held against the convolutions of the bellows 12 as shown in FIG. 2. Further as shown in FIGS. 2 and 5, the end portions of the wicks 46, 48, 50 and 52 are bent at right angles with respect to the central portions thereof so that they lie along the inner surfaces 56 and 58 of the outer end walls 60 and 62 of the upper and lower vapor chambers 14 and 16 (FIG. 2). The inner surfaces 56 and 58, moreover, include a plurality of regularly spaced grooves 64 and 66 which substantially cover the surface as shown in FIG. 5. The grooves are intended to act as conductive channels for a working fluid, such as ammonia which is adapted to be conducted in a liquid state between the top and bottom vapor chamber end walls 56 and 58 by means of the wicks 46, 48, 50 and 52.

Figure 3:
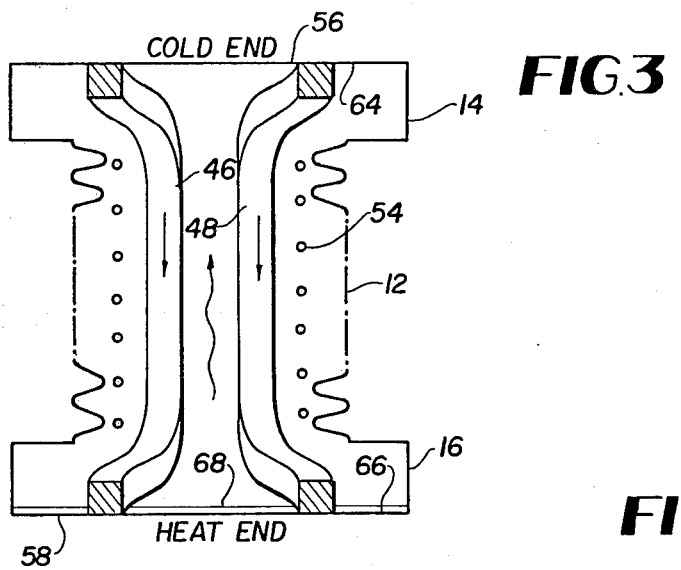
FIG. 3 is a diagrammatic representation of the invention intended to illustrate its mode of operation.

The operation of the thermal switch thus far disclosed can be best understood by reference to FIG. 3 wherein working fluid introduced to the lower evaporation chamber 16 forms a reservoir 68. Since the chamber 16 is at the heat end of the apparatus and inasmuch as it is in contact with the heat source plate 20 as shown in FIG. 1, heat causes the working fluid to vaporize, whereupon it expands and rises to the upper chamber 14. When sufficient expansion has occurred, the gas expands the bellows 12, causing the interface plate 18 to contact the sink plate 22, causing a relatively cold end to be formed, whereupon condensation occurs on the inner surface 56 which is conducted by means of the grooves 64 to the wicks 46, 48, 50 and 52 where the condensed fluid flows back down to inner surface 58, where it is conducted and distributed thereover by means of grooves 66. The fluid is then evaporated again to repeat the expansion and condensation cycle. Once the heat end of the apparatus is cooled a predetermined amount, the vaporization action is no longer able to expand the bellows 12 sufficiently to maintain the intimate contact between the interface plate 18 and the sink plate 22 whereupon the three bias springs 26, 27 and 28 reestablish the gap 24, thus terminating heat transfer between the source plate 20 and the sink plate 22. It is significant to note that the two wicks 50 and 52 are in contact with the bellows 12 due to the reaction of the retaining spring 54, thereby causing condensed liquid which forms on the convolutions of the bellows 12 to be drawn into the wicks where it is transferred downwardly to the lower vapor chamber 16.

Thus, what has been shown and described is a flexible heat pipe switch which includes a wick structure of an improved design which is not only adapted to provide liquid transfer between the upper and lower vapor chambers, but also to remove any accumulated liquid which happens to build up on the convolutions of the bellows. Additionally, the grooved transport surfaces in contact with the end portions of the wicks 46, 48, 50 and 52 facilitate a more efficient evaporation-condensation cycle.

Having thus shown and described what is at present considered to be the preferred embodiment of the invention, the same has been provided by way of explanation and not limitation. Accordingly, all modifications, alterations and changes coming within the spirit and scope of the invention are herein meant to be included.

I claim:

1. A heat pipe thermal switch for the controlled transfer of heat from a body (20) to a heat sink (22) comprising:

a bellows (2) defining an expansible vapor chamber for vapor of a working fluid;

an evaporation chamber (16) and a condensation chamber (14) for said vapor at opposite ends of the bellows (12), said evaporation chamber (16) being thermally coupled to a body (20) and said condensation chamber (14) being alternately in thermal contact and separated from a heat sink (12) across a gap (24) between the vapor chamber and said heat sink upon expansion and contraction of said bellows (12) in response to vaporization of said working fluid upon the coupling of heat thereto from said body (20);

set point control means (26, 27, 28, 30, 31, 32) for adjusting said gap (24) for a contracted state of said bellows (12);

first and second capillary means (46, 48, 50, 52) located inside said bellows (12) for providing fluid coupling of said working fluid between said evaporation and condensation chambers (16, 14); and means (54) for maintaining a spaced separation of said first and second capillary means (46, 48, 50, 52) for preventing liquid communication therebetween and wherein one of said capillary means (50, 52) is in liquid communications with the inside surface of said bellows (12).

2. The thermal switch as defined by claim 1 and wherein said evaporation and condensation chambers (16, 14) include grooved inside surfaces (56, 58) in contact with respective end portions of said capillary means (46, 48, 50, 52).

3. The thermal switch as defined by claim 2 wherein said first and second capillary means (46, 48, 50, 52) are each comprised of at least one elongated which extending between said evaporation chamber (16) and said condensation chamber (14).

4. The thermal switch as defined by claim 3 wherein said means (54) for maintaining a spaced separation between said at least one wick of said first and second capillary means (46, 48, 50, 52) comprises a coiled retainer spring and wherein the central portion of one of said wicks (46, 48) is located inside of said retainer spring and the central portion of the other of said wicks (50, 52) is located outside of said retainer spring (54).

5. The thermal switch as defined by claim 1 wherein said set point control means (26, 28, 30, 32) comprises at least one tension spring (26, 27, 28) and means (30, 31, 32) for varying tension of said at least one spring.

6. The thermal switch as defined by claim 5 wherein said means (30, 31, 32) for varying the tension of said spring comprises at least one turnbuckle.

7. The thermal switch as defined by claim 1 wherein said set point control means (26, 27, 28, 30, 31, 32) comprises a plurality of opposing tension springs (26, 27, 28) coupled between said evaporation chamber (16) and said condensation chamber (14) and means (30, 31, 32) for varying the tension of said plurality of springs.

8. The thermal switch as defined by claim 7 wherein said plurality of springs comprises at least three springs.

9. The thermal switch as defined by claim 7 wherein said means (30, 31, 32) for varying the tension of said plurality of springs (26, 27, 28) includes respective turnbuckles formed by pairs of rod members (34, 36, 38, 40) having threaded portions connected together by threaded nuts (42, 44).

10. The thermal switch as defined by claim 1 and additionally including interface means (18) on the outer surface of said condensation chamber (14) and wherein said set point control means comprises a plurality of controlled tension springs (26, 27, 28) connected between said interface means (18) and said evaporation chamber (16).

11. The thermal switch as defined by claim 1 wherein said first and second capillary means (46, 48, 50, 52) comprises a respective pair of wick type members and said means (54) for maintaining a spaced separation comprises a coiled retainer spring wherein the central portions of one pair of wick type members (46, 48) is located inside of said retainer spring (54) and the central portions of the other pair of wick type members (50, 52) lies outside of said retainer spring (54).

12. The thermal switch as defined by claim 10 wherein said evaporation chamber (16) and said condensation chamber (14) include inside surfaces (58, 56) having a respective plurality of fluid conductive grooves (64, 66) formed therein contacting opposite ends of both pairs of said wick type members (46, 48, 50, 52).

13. The thermal switch as defined by claim 12 wherein said grooves (64, 66) are arranged in substantially mutually parallel relationship.

14. The thermal switch as defined by claim 12 wherein said first and second pairs of wick type members (46, 48, 50, 52) are comprised of flexible mesh wicks and include end portions which are substantially offset with their respective central portions located inside and outside of said retainer spring (54).

15. The thermal switch as defined by claim 14 wherein said set point control means comprises a plurality of turnbuckles (30, 31, 32) and an equal plurality of tension springs (26, 27, 28) coupled between said evaporation chamber (16) and said condensation chamber (14) by means of said turnbuckles (30, 31, 32).

16. The thermal switch as defined by claim 15 wherein each of said plurality of turnbuckles are comprised of a pair of rod members (34, 36, 38, 40) having mutually opposing end portions including a thread formed thereon and interconnected by means of a threaded nut (42, 44) adapted to draw said pairs of rod members together.

17. The thermal switch as defined by claim 16 and additionally including an interface plate member (18) on said condensation chamber (14) facing said heat sink (22), wherein one rod member (34, 38) of said pairs of rod members (34, 36, 38, 40) is attached to said interface plate member (18).

* * * * *